US008877644B2

(12) United States Patent
Ono et al.

(10) Patent No.: US 8,877,644 B2
(45) Date of Patent: Nov. 4, 2014

(54) POLISHING SOLUTION FOR COPPER POLISHING, AND POLISHING METHOD USING SAME (75) Inventors: Hiroshi Ono, Hitachi (JP); Takashi Shinoda, Hitachi (JP); Yuuhei Okada, Hitachi (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/639,512

(22) PCT Filed: Jun. 6, 2011

(86) PCT No.: PCT/JP2011/062941
§ 371 (c)(1),
(2), (4) Date: Oct. 4, 2012

(87) PCT Pub. No.: WO2012/008237
PCT Pub. Date: Jan. 19, 2012

(65) Prior Publication Data
US 2013/0020283 A1 Jan. 24, 2013

(30) Foreign Application Priority Data
Jul. 14, 2010 (JP) ................................ P2010-159745

(51) Int. Cl.
*H01L 21/302* (2006.01)
(52) U.S. Cl.
USPC ............................ 438/692; 438/691; 216/89
(58) Field of Classification Search
USPC ......... 438/690, 691, 692, 693, 694; 252/79.1, 252/79.2, 792; 216/88, 90, 89
See application file for complete search history.

(56) References Cited

U.S. PATENT DOCUMENTS

| 2008/0257862 A1* | 10/2008 | Belov et al. ..................... 216/41 |
| 2009/0246957 A1* | 10/2009 | Kamimura ..................... 438/693 |
| 2010/0072418 A1* | 3/2010 | Mizutani et al. .............. 252/79.1 |
| 2010/0075500 A1* | 3/2010 | Yoshikawa et al. ........... 438/692 |

FOREIGN PATENT DOCUMENTS

| JP | 02-278822 A | 11/1990 |
| JP | 2001-187880 A | 7/2001 |
| JP | 2001-189295 A | 7/2001 |
| JP | 2003-124160 A | 4/2003 |

(Continued)

OTHER PUBLICATIONS

International Preliminary Report on Patentability issued Feb. 12, 2013, in International Application No. PCT/JP2011/062941.

(Continued)

*Primary Examiner* — Lan Vinh
(74) *Attorney, Agent, or Firm* — Miles & Stockbridge P.C.

(57) ABSTRACT

The polishing solution for copper polishing of the invention comprises a first organic acid component which is at least one type selected from among an organic acid containing a hydroxyl group, an organic acid salt and an organic acid anhydride, an inorganic acid component which is at least one type selected from among a dibasic or greater inorganic acid and an inorganic acid salt, an amino acid, a protective film-forming agent, an abrasive grain, an oxidizing agent and water, wherein the inorganic acid component content in terms of inorganic acid is 0.15 mass % or greater, the amino acid content is 0.30 mass % or greater, the protective film-forming agent content is 0.10 mass % or greater, based on the entire polishing solution for copper polishing, and the ratio of the first organic acid component content in terms of organic acid with respect to the protective film-forming agent content is at least 1.5.

19 Claims, 3 Drawing Sheets

(56) References Cited

FOREIGN PATENT DOCUMENTS

| | | |
|---|---|---|
| JP | 2003-297779 A | 10/2003 |
| JP | 2004-048033 A | 2/2004 |
| JP | 2005-014206 A | 1/2005 |
| JP | 2006-302968 A | 11/2006 |
| JP | 2007-103485 A | 4/2007 |
| JP | 2007-150264 A | 6/2007 |
| JP | 2008-523616 A | 7/2008 |
| JP | 2008-288398 A | 11/2008 |

OTHER PUBLICATIONS

F. B. Kaufman et al., "Chemical-Mechanical Polishing for Fabricating Patterned W Metal Features as Chip Interconnects", J. Electrochem. Soc., vol. 138, No. 11, Nov. 1991, pp. 3460-3464.

* cited by examiner

POLISHING SOLUTION FOR COPPER POLISHING, AND POLISHING METHOD USING SAME

TECHNICAL FIELD

The present invention relates to a polishing solution for copper polishing and to a polishing method using the same.

BACKGROUND ART

The use of copper alloys as wiring material substitutes for conventional aluminum alloys is advancing, with the aim of increasing the performance of LSIs. Copper alloys are poorly suitable for micromachining by dry etching which is often used for forming conventional aluminum alloy wiring. The "damascene method" has therefore been largely employed for micromachining of copper alloys, the method being one in which a thin-film of a copper alloy is accumulated on an insulating film having pre-formed trenches (recesses) and elevated sections (protrusions) to embed the copper alloy in the trenches, and then the copper alloy thin-film accumulated on the elevated sections (the copper alloy thin-film on sections other than the trenches) is removed by CMP to form embedded wiring (see Patent document 1 below, for example).

Chemical mechanical polishing (CMP) of metals such as copper alloys commonly involves attaching a pad (abrasive pad or abrasive cloth) onto a circular polishing plate (platen), wetting the pad surface with a polishing solution for metals, pressing the metal film-formed surface of a base substrate against the pad surface, rotating the polishing platen with a prescribed pressure (hereunder referred to as "polishing pressure") being applied to the metal film from the back side of the base substrate, and removing the metal film on the elevated sections by mechanical friction between the polishing solution and the metal film on the elevated sections.

A polishing solution for metals to be used for CMP usually comprises an oxidizing agent and solid abrasive grains (hereunder referred to simply as "abrasive grain"), and it further comprises a metal oxide solubilizer, protective film-forming agent and the like if necessary. The basic mechanism of CMP employing a polishing solution comprising an oxidizing agent is considered to be that, first, the metal film surface is oxidized by the oxidizing agent to form an oxidation layer, and the metal film is polished by shaving the oxidation layer with the abrasive grain. In this polishing method, since the oxidation layer on the metal film surface embedded in the trenches of the insulating film is not significantly contacted with the pad and is not reached by the shaving effect of the abrasive grain, the metal film on the elevated sections is removed as CMP proceeds, thus flattening the substrate surface (see Non-patent document 1 below, for example).

For ordinary manufacturing of an LSI, the film thickness of the copper alloy thin-film to be polished is about 1 μm, and a polishing solution which allows a polishing rate of about 5000 Å/min is used (see Patent document 2 below, for example). In recent years, CMP treatment of copper alloys is being applied for manufacture of high performance microcircuit boards such as package boards, and also in the formation of Through Silicon Via (TSV) that have become an object of interest in new mounting methods.

CITATION LIST

Patent Literature

[Patent document 1] Japanese Unexamined Patent Application Publication HEI No. 2-278822

[Patent document 2] Japanese Unexamined Patent Application Publication No. 2003-124160

Non-Patent Literature

[Non-patent document 1] Journal of Electrochemical Society, Vol. 138, No. 11(1991), p. 3460-3464

SUMMARY OF INVENTION

Technical Problem

However, because the metal film thicknesses are larger for such purposes compared to LSIs, problems of low polishing rate and reduced productivity occur with conventional polishing solutions for LSIs.

Since formation of TSVs, in particular, requires polishing of metal films with film thicknesses of 4 μm or greater, there is a demand for polishing solutions that allow polishing with high polishing rates and excellent polished flatness.

The polished flatness is represented as the condition of recesses on the surface of embedded wiring compared to the regions surrounding the embedded wiring. The flatness is poorer with more recessing of the wiring surface compared to the surrounding regions, and can result in impaired wiring resistance or swelling of upper layers laminated on the wirings. One cause of reduced flatness is a high rate of elution of copper (etching rate) from wirings by the polishing solution. Consequently, the etching rate can be treated as an index for evaluation of flatness. In order to improve flatness, it is necessary to minimize elution of copper from the wiring, or in other words, to lower the etching rate.

The amount of copper complex generated when polishing a copper-containing metal film is greater with high-rate polishing than with relatively low-rate polishing. When a copper-containing metal film is subjected to high-rate polishing, therefore, a problem occurs in the form of a phenomenon in which copper complex remains on the pad, thereby lowering the pad properties (pad staining). The copper complex adhering to the pad can cause clogging of the pad and lower the polishing rate, thus reducing productivity.

The present invention has been accomplished in light of these circumstances, and it is an object thereof to provide a polishing solution for copper polishing that allows polishing of copper-containing metal films in a condition with minimal formation of pad stains, while improving the polishing rate and polished flatness compared to conventional polishing solutions, as well as a polishing method using it.

Solution to Problem

The present inventors have found that the problem described above can be solved by controlling the kinds of components and their contents in a polishing solution at least comprising at least one type selected from among an organic acid, an organic acid salt and an organic acid anhydride, at least one type selected from among an inorganic acid and an inorganic acid salt, an amino acid, and a protective film-forming agent. Specifically, the present inventors found that if specific compounds are used as the organic acid and inorganic acid and the contents of each of the components are within specified ranges, it is possible to polish the copper-containing metal films in a condition with minimal formation of pad stains, while improving the polishing rate and polished flatness.

That is, the invention provides a polishing solution for copper polishing that comprises a first organic acid component which is at least one type selected from among an organic acid containing a hydroxyl group, a salt of the organic acid and an anhydride of the organic acid, an inorganic acid component which is at least one type selected from among a dibasic or greater inorganic acid and a salt of the inorganic acid, an amino acid, a protective film-forming agent, an abrasive grain, an oxidizing agent and water, wherein the content of the inorganic acid component in terms of inorganic acid is 0.15 mass % or greater, the content of the amino acid is 0.30 mass % or greater, the content of the protective film-forming agent is 0.10 mass % or greater, based on the entire polishing solution for copper polishing, and the ratio of the content of the first organic acid component in terms of organic acid with respect to the content of the protective film-forming agent is at least 1.5.

With a polishing solution for copper polishing according to the invention, it is possible to polish the copper-containing metal films in a condition with minimal formation of pad stains, while improving the polishing rate and polished flatness, compared to conventional polishing solutions. With the polishing solution for copper polishing of the invention, it is thus possible to accomplish even more rapid polishing treatment and ensure sufficient productivity even for purposes that require polishing of thick metal films, such as in production of high performance circuit boards or TSVs. In addition, since the polishing solution for copper polishing is a pH buffer solution with powerful dissolving action, comprising a first organic acid component, an inorganic acid component and an amino acid, it is resistant to variations in pH even when an object to be polished is polished and copper dissolves in the polishing solution. Consequently, high polishing rate can be stably maintained without dependence on the extent to which the polishing progresses.

When the inorganic acid component is an inorganic acid salt, the phrase "content of the inorganic acid component in terms of inorganic acid" as used herein refers to the mass of the inorganic acid in a molar amount equal to the content (mol) of the inorganic acid salt. That is, if the content of the inorganic acid salt is X moles, it indicates the mass corresponding to X moles of the inorganic acid. Also, when the first organic acid component is an organic acid salt or organic acid anhydride, the phrase "content of the first organic acid component in terms of organic acid" as used herein refers to the mass of the organic acid in a molar amount equal to the content (mol) of the organic acid salt or organic acid anhydride. That is, if the content of the organic acid salt or organic acid anhydride is X moles, it indicates the mass corresponding to X moles of the organic acid.

Unless otherwise specified, the term "copper" as used herein includes pure copper, copper alloy, copper oxide, copper alloy oxides, and the like. Also unless otherwise specified, the term "copper-containing metal film" as used herein includes single films such as pure copper films, copper alloy films, copper oxide films and copper alloy oxide films, as well as their composite films, and laminated films comprising such single films or composite films with other metal films.

The present inventors have found that if the polishing solution for copper polishing of the invention further comprises at least one type selected from among an organic acid containing no hydroxyl group, a salt of the organic acid and an anhydride of the organic acid, it is possible to polish the copper-containing metal films in a condition with minimal formation of pad stains, while achieving higher levels of both polishing rate and polished flatness. The 5 components, namely the first organic acid component, inorganic acid component, amino acid, protective film-forming agent and second organic acid component, will be collectively referred to hereunder as "chemical components" in some cases.

In other words, the polishing solution for copper polishing of the invention may further comprise a second organic acid component which is at least one type selected from among an organic acid containing no hydroxyl group, a salt of the organic acid and an anhydride of the organic acid.

The total of the content of the first organic acid component in terms of organic acid and the content of the second organic acid component in terms of organic acid is preferably 0.20 mass % or greater based on the entire polishing solution for copper polishing. This can further improve the polishing rate. When the second organic acid component is an organic acid salt or organic acid anhydride, the phrase "content of the second organic acid component in terms of organic acid" as used herein refers to the mass of the organic acid in a molar amount equal to the content (mol) of the organic acid salt or organic acid anhydride. That is, if the content of the organic acid salt or organic acid anhydride is X moles, it indicates the mass corresponding to X moles of the organic acid.

Preferably, the second organic acid component is at least one type selected from among an organic acid containing no hydroxyl group and 2 or more carboxyl groups, a salt of the organic acid and an anhydride of the organic acid, and the first acid dissociation constant (pKa1) of the organic acid is 1.0 to 3.0. This can further improve the polishing rate. The first acid dissociation constant (pKa1) is the acid dissociation constant for the first dissociable acidic group, and it is the negative common logarithm of the equilibrium constant Ka1 of the group.

The second organic acid component is preferably at least one type selected from among oxalic acid, maleic acid, maleic anhydride and malonic acid. This can further improve the polishing rate.

The content of the first organic acid component in terms of organic acid is preferably 0.10 mass % or greater based on the entire polishing solution for copper polishing. This can further improve the polishing rate.

The first organic acid component is preferably an aliphatic hydroxycarboxylic acid, and more preferably it is at least one type selected from among glycolic acid, malic acid and citric acid. This can further improve the polishing rate, while also further inhibiting formation of pad stains.

The pH of the polishing solution for copper polishing of the invention is preferably 1.5 to 4.0. This will improve the function as a pH buffer solution, and will facilitate stable maintenance of a high polishing rate.

The inorganic acid component is preferably at least one type selected from among sulfuric acid and phosphoric acid. This will allow even higher levels of both polishing rate and flatness to be achieved.

The amino acid is preferably at least one type selected from among glycine, alanine, valine, leucine, isoleucine, serine, threonine, cysteine, cystine, methionine, aspartic acid, glutamic acid, lysine, arginine, phenylalanine, tyrosine, histidine, tryptophan, proline, oxyproline, asparagine and glutamine, and more preferably glycine. This can further improve the polishing rate while further improving the polished flatness.

The protective film-forming agent is preferably at least one type selected from among quinaldinic acid, anthranilic acid, salicylaldoxime, a thiazole compound, a triazole compound, an imidazole compound, a pyrazole compound and a tetrazole compound, and more preferably a triazole compound. Triazole compound is preferably at least one type selected from among benzotriazole and a benzotriazole derivative. In these cases, the polishing solution for copper polishing of the invention will be allowed to be obtained as a polishing solution with excellent balance between polishing rate and corrosion resistance.

The abrasive grain preferably comprises at least one type selected from among silica, alumina, zirconia, ceria, titania, silicon carbide, polystyrene, polyacryl and polyvinyl chloride, and more preferably it comprises at least one type selected from among colloidal silica and colloidal alumina. This will allow even higher levels of both polishing rate and flatness to be achieved.

The mean particle size of the abrasive grain grains is preferably not greater than 100 nm. This will allow even higher levels of both polishing rate and flatness to be achieved.

The oxidizing agent is preferably at least one type selected from among hydrogen peroxide, persulfuric acid, a persulfuric acid salt, periodic acid, a periodic acid salt, an iodic acid salt and a bromic acid salt. This can even further improve the polishing rate.

The invention also provides a polishing method that comprises a step in which a copper-containing metal film is polished using the polishing solution for copper polishing described above, to remove at least a portion of the metal film.

With the polishing method of the invention, it is possible to polish the copper-containing metal films in a condition with minimal formation of pad stains, while improving the polishing rate and polish-finished flatness compared to conventional polishing solutions. With the polishing method of the invention, it is thus possible to accomplish even more rapid polishing treatment and ensure sufficient productivity and product yield even for purposes that require polishing of thick metal films, such as in production of high performance circuit boards or TSVs.

Advantageous Effects of Invention

According to the invention, it is possible to polish the copper-containing metal films in a condition with minimal formation of pad stains, while improving the polishing rate and polished flatness compared to conventional polishing solutions. The invention can therefore provide a polishing solution for copper polishing that can accomplish rapid polishing treatment and ensure sufficient productivity, even for purposes that require polishing of thick metal films, such as in production of high performance circuit boards or TSVs, as well as a polishing method using the polishing solution. According to the invention, drastically higher polishing rate for copper-containing metal films can be obtained compared to conventional polishing solutions, and for example, a polishing solution with a polishing rate of 30000 Å/min or greater for copper can be obtained.

DESCRIPTION OF EMBODIMENTS

The polishing solution for copper polishing (hereunder also referred to simply as "polishing solution") according to this embodiment comprises (A) a first organic acid component which is at least one type selected from among an organic acid containing a hydroxyl group, a salt of the organic acid and an anhydride of the organic acid, (B) an inorganic acid component which is at least one type selected from among a dibasic or greater inorganic acid and a salt of the inorganic acid, (C) an amino acid, (D) a protective film-forming agent, (E) an abrasive grain, (F) an oxidizing agent and (G) water. The polishing solution of this embodiment may further comprise (H) a second organic acid component which is at least one type selected from among an organic acid containing no hydroxyl group, a salt of the organic acid and an anhydride of the organic acid. In the polishing solution of this embodiment, the content of component (B) is 0.15 mass % or greater, the content of component (C) is 0.30 mass % or greater, the content of component (D) is 0.10 mass % or greater based on the entire polishing solution, and the ratio of the content of component (A) with respect to the content of component (D) is at least 1.5.

The protective film-forming agent as component (D) provides an effect of inhibiting etching of copper by formation of a protective film on the copper surface, but generally this may interfere with the polishing rate, and also may form insoluble complexes during polishing, which can cause pad stains. On the other hand, the polishing solution of this embodiment uses component (A) and component (D) in combination, with the content of component (A) in a prescribed range with respect to the content of component (D), and further uses component (B) and component (C) as constituent components of the polishing solution, thereby minimizing formation of pad stains while improving the polishing rate and polished flatness.

While the reason for the effect of improved polishing rate by the polishing solution of this embodiment is not completely understood, the present inventors conjecture as follows. Specifically, the action of component (A), component (B) and component (D) cause formation of a "reaction layer" containing component (D) and copper ion on the copper surface. Also, chelation of component (C) by the copper ion presumably renders the reaction layer more removable, so that polishing is promoted.

It is believed that such polishing processes do not independently proceed simultaneously in parallel, but rather each individual polishing process proceeds in linkage with another polishing process. Thus, even if only one of component (A), component (B), component (C) and component (D) is increased, the polishing process depending on other component constitutes a bottleneck (rate-determining step), and the overall polishing rate is not effectively improved. On the other hand, the polishing solution of this embodiment employs component (A), component (B), component (C) and component (D) with specific amounts of each of component (B), component (C) and component (D), thereby allowing each polishing process to be promoted and the polishing rate to be effectively improved.

In addition, the polishing solution of this embodiment exhibits an effect which allows reduction in the total content of components required to obtain a prescribed improving effect on polishing rate, compared to the case using either component (A), component (B) or component (C) alone or the case using any two selected from among them. Moreover, while storage stability of a conventional polishing solution is reduced if the polishing solution contains at least one type selected from among component (A), component (B) and component (C) at above their soluble contents in the polishing solution, the polishing solution of this embodiment can minimize such reduction in storage stability.

The polishing solution of this embodiment will now be described in greater detail. In cases where the composition contains more than one substance corresponding to each component, the references to the amounts of each of the components throughout the following description will refer to the total amounts of those substances in the composition, unless otherwise specified.

(pH of Polishing Solution)

The pH of the polishing solution is not particularly restricted and may be in the range of 1.0 to 13.0, for example, but from the viewpoint of further improving the polishing rate for copper by CMP, it is preferably in the acidic or neutral range (not higher than 7.0), and more preferably in the range of 1.5 to 4.0 from the viewpoint of inhibiting corrosion of copper films. The pH of the polishing solution of at least 1.5 will help avoid the phenomenon resulting in reduction in flatness of the copper film, such as excessive dishing, and for the same reason the pH of the polishing solution is more preferably at least 2.0. If the pH of the polishing solution is not higher than 4.0, the polishing rate by CMP will tend to increase so as to be a more practical polishing solution, and for the same reason the pH of the polishing solution is more preferably not higher than 3.8 and even more preferably not higher than 3.5.

The polishing solution of this embodiment is preferably a pH buffer solution comprising component (A) and component (B), and an optional component (H). When the inorganic acid used as component (B) is a strong acid, including a large amount of inorganic acid will lower the pH of the polishing solution, tending to make it difficult to adjust the pH to within the prescribed range (for example, the range of 1.5 to 4.0). With the polishing solution of this embodiment, however, which comprises component (A) and component (C) in addition to component (B) and optionally comprises component (H), the polishing solution of this embodiment can be easily prepared as a pH buffer solution with a pH in the prescribed range (for example, in the range of 1.5 to 4.0) by adjusting the contents of component (A), component (H), component (B) and component (C).

The pH of the polishing solution can be appropriately adjusted by the contents of component (A), component (H), component (B) and component (C). An acidic component or alkaline component may also be added to the polishing solution of this embodiment as a pH regulator for adjustment to the desired pH. Examples of acidic components include monobasic inorganic acids such as hydrochloric acid or nitric acid. Examples of alkaline components include ammonia, sodium hydroxide and tetramethylammonium hydroxide. These may be used alone or in combinations of two or more. Naturally, addition of a pH regulator to the polishing solution is unnecessary if the pH of the polishing solution is already within the desired range without a pH regulator.

The pH of the polishing solution can be measured with a pH meter (for example, a Model PH81 by Yokogawa Electric Corp.). The pH value is measured by placing an electrode in the polishing solution after 2-point calibration using standard buffer (phthalate pH buffer: pH 4.01 (25° C.), neutral phosphate pH buffer: pH 6.86 (25° C.)), and by measuring the value upon stabilization after an elapse of 2 minutes or more.

(Component (A): Organic Acid Containing Hydroxyl Group, Salt of Organic Acid and Anhydride of Organic Acid)

From the viewpoint of allowing polishing rate to be improved while inhibiting pad stains, component (A) is a first organic acid component which is at least one type selected from among an organic acid containing a hydroxyl group, a salt of the organic acid and an anhydride of the organic acid. Since the organic acid of component (A) contains a hydroxyl group, it allows insoluble complexes generated by polishing of the copper film to be converted to more water-soluble complexes, compared to an organic acid without a hydroxyl group, and thus helps to inhibit formation of pad stains. In this case, the term "hydroxyl group" does not include the —OH groups present in carboxyl groups.

Component (A) is not particularly restricted, but is preferably a water-soluble organic acid. Examples of organic acids containing hydroxyl groups include aliphatic hydroxycarboxylic acids such as glycolic acid, malic acid, citric acid, lactic acid, tartaric acid, citramalic acid and isocitric acid;

hydroxyphenylacetic acids such as mandelic acid, 3-hydroxyphenylacetic acid, 3,4-dihydroxyphenylacetic acid and 2,5-dihydroxyphenylacetic acid;

monohydroxybenzoic acids such as salicylic acid, creatine acid, 3-methoxy-4-hydroxybenzoic acid and 3,5-dimethoxy-4-hydroxybenzoic acid;

dihydroxybenzoic acids such as 2,3-dihydroxybenzoic acid, 2,5-dihydroxybenzoic acid, 3,4-dihydroxybenzoic acid and 2,4-dihydroxy-6-methylbenzoic acid; and trihydroxybenzoic acids such as 2,3,4-trihydroxybenzoic acid, gallic acid and 2,4,6-trihydroxybenzoic acid. Examples of salts of these organic acids include their ammonium salts. Examples of acid anhydrides of the organic acids include lactic anhydride. Component (A) may be used as a single compound alone or a combination of two or more compounds. Preferred among these compounds mentioned for component (A) are aliphatic hydroxycarboxylic acids, from the viewpoint of an even more excellent effect of improving polishing rate and of inhibiting pad stains, and also ready availability, and even more preferred are at least one type selected from among glycolic acid, malic acid and citric acid.

The content of component (A) (the content in terms of organic acid) is preferably 0.10 mass % or greater, more preferably 0.20 mass % or greater, even more preferably 0.30 mass % or greater and especially preferably 0.40 mass % or greater based on the entire polishing solution, from the viewpoint of obtaining a more superior polishing rate. Also, since the polishing rate will tend not to improve beyond a certain point even with addition of component (A) to the polishing solution above a certain amount, the content of component (A) is preferably not greater than 5.00 mass %, more preferably not greater than 4.00 mass %, even more preferably not greater than 3.00 mass % and especially preferably not greater than 2.00 mass % based on the entire polishing solution, from the viewpoint of minimizing the amount of component (A) used.

(Component (H): Organic Acid Containing No Hydroxyl Group, Salt of Organic Acid and Anhydride of Organic Acid)

The polishing solution of this embodiment may comprise component (H) as an organic acid component different from component (A). Component (H) is a second organic acid component which is at least one type selected from among an organic acid containing no hydroxyl group, a salt of the organic acid and an anhydride of the organic acid. When component (H) is used alone instead of in combination with component (A), the polishing rate may sometimes be improved, though usually with an insufficient effect of inhibiting formation of pad stains. On the other hand, using component (H) in combination with component (A) as in the polishing solution of this embodiment allows higher levels of both a pad stain-inhibiting effect and polishing rate-improving effect to be achieved. In this case, the term "hydroxyl group" does not include —OH groups present in carboxyl groups, and component (H) may be an organic acid containing a carboxyl group.

Component (H) is preferably at least one type selected from among an organic acid containing no hydroxyl group and 2 or more carboxyl groups, a salt of the organic acid and an anhydride of the organic acid. The organic acid containing 2 or more carboxyl groups is preferably sufficiently water-soluble so that an effective amount will dissolve to exhibit its effect, and any substance known in the prior art may be used without any particular restrictions. Examples of organic acids containing two carboxyl groups include oxalic acid, maleic acid, malonic acid and oxaloacetic acid. Examples of organic acids containing 3 or more carboxyl groups include trimellitic acid, 1,2,4-butanetricarboxylic acid and 1,2,3-propanetricarboxylic acid. Examples of salts of organic acids containing 2 or more carboxyl groups include ammonium salts of the aforementioned organic acids. Examples of acid anhydrides of organic acids containing two carboxyl groups include maleic anhydride. Examples of acid anhydrides of organic acids containing 3 or more carboxyl groups include trimellitic anhydride. From the viewpoint of allowing the polishing rate by CMP to be further improved, it is preferably at least one type selected from among an organic acid containing no hydroxyl group and two carboxyl groups, a salt of the organic acid and an anhydride of the organic acid, and more preferably oxalic acid, maleic acid, maleic anhydride or malonic acid. Component (H) may be an organic acid containing no hydroxyl group and one carboxyl group, a salt of the organic acid or an anhydride of the organic acid, and examples of such organic acids include saturated fatty acids such as acetic acid. Component (H) may be used as a single compound alone or a combination of two or more compounds.

The pKa1 of the organic acid containing 2 or more carboxyl groups is preferably not higher than 3.0, more preferably not higher than 2.7, even more preferably not higher than 2.6 and especially preferably not higher than 2.5, from the viewpoint of reinforcing interaction with copper and obtaining an even higher polishing rate. The pKa1 of the organic acid containing 2 or more carboxyl groups is preferably 1.0 or higher, since a value of at least 1.0 will tend to limit the halogen content and reduce the environmental load. Examples of organic acids containing 2 or more carboxyl groups and pKa1 values of 1.0 to 3.0 include oxalic acid, maleic acid, malonic acid and oxaloacetic acid. For the "pKa1" value of an organic acid, reference may be made to Kagaku Binran, Kisohen II (5th Revision, Maruzen).

The content of component (H) (the content in terms of organic acid) is preferably such that the total including the content of component (A) is within the specified range. Specifically, the total of the content of component (A) and the content of component (H) is preferably 0.20 mass % or greater, more preferably 0.30 mass % or greater and even more preferably 0.40 mass % or greater based on the entire polishing solution, from the viewpoint of obtaining a more superior polishing rate. Also, since the polishing rate will tend not to improve beyond a certain point even with addition of component (H) above a certain amount, the total of the content of component (A) and the content of component (H) is preferably not greater than 5.00 mass %, more preferably not greater than 4.00 mass %, even more preferably not greater than 3.00 mass % and especially preferably not greater than 2.00 mass % based on the entire polishing solution, from the viewpoint of minimizing the amount of component (H) used.

(Component (B): Dibasic or Greater Inorganic Acid and Salt of Inorganic Acid)

Component (B) may be a known dibasic or greater inorganic acid or its inorganic acid salt, without any particular restrictions, with a dibasic inorganic acid and its inorganic acid salt being preferred. Examples of dibasic or greater inorganic acids include dibasic inorganic acids such as sulfuric acid, sulfurous acid and phosphonic acid, and tribasic inorganic acids such as phosphoric acid. Salts of these inorganic acids may be their ammonium salts. From the viewpoint of allowing the polishing rate by CMP to be further increased while further improving the flatness of copper films, component (B) is preferably at least one type selected from among sulfuric acid, phosphoric acid, and mixtures of sulfuric acid and phosphoric acid. Component (B) may be used as a single compound alone or a combination of two or more compounds. A monobasic inorganic acid has a small effect of improving polishing rate, but may be used in combination with component (B).

The content of component (B) (the content in terms of inorganic acid) is 0.15 mass % or greater, preferably 0.18 mass % or greater and more preferably 0.20 mass % or greater based on the entire polishing solution, from the viewpoint of obtaining a superior polishing rate. Since the polishing rate will tend not to increase beyond a certain point even with addition of component (B) to the polishing solution above a certain amount, the content of component (B) is preferably not greater than 5.00 mass %, more preferably not greater than 4.00 mass %, even more preferably not greater than 3.00 mass % and especially preferably not greater than 2.00 mass % based on the entire polishing solution, from the viewpoint of minimizing the amount of component (B) used.

(Component (C): Amino acid)

Component (C) is an amino acid used for adjustment of the pH and dissolution of copper. There are no particular restrictions on the amino acid so long as it dissolves even slightly in water, and examples include glycine, alanine, valine, leucine, isoleucine, serine, threonine, cysteine, cystine, methionine, aspartic acid, glutamic acid, lysine, arginine, phenylalanine, tyrosine, histidine, tryptophan, proline, oxyproline, asparagine and glutamine. These may be used alone or in combinations of two or more.

Preferred for use as component (C) are amino acids having a first acid dissociation constant (pKa1) of 2.0 to 3.0, from the viewpoint of easier adjustment of the pH of the polishing solution to 1.5-4.0. Among the compounds mentioned above, such amino acids may be glycine, alanine, valine, leucine, isoleucine, serine, threonine, methionine, aspartic acid, glutamic acid, lysine, arginine and tryptophan. Glycine is especially preferred for a greater effect of improving polishing rate and flatness, and for economy. When component (C) is a compound with a single pKa, the single pKa is referred to as "pKa1". For the "pKa1" value of an amino acid, reference may be made to Kagaku Binran, Kisohen II (5th Revision, Maruzen).

The content of component (C) is 0.30 mass % or greater and preferably 0.35 mass % or greater based on the entire polishing solution, from the viewpoint of obtaining a superior polishing rate. Since the polishing rate will tend not to increase beyond a certain point even with addition of component (C) to the polishing solution above a certain amount, the content of component (C) is preferably not greater than 5.00 mass %, more preferably not greater than 4.00 mass %, even more preferably not greater than 3.00 mass % and especially preferably not greater than 2.00 mass % based on the entire polishing solution, from the viewpoint of minimizing the amount of component (C) used.

(Component (D): Protective film-forming agent)

The protective film-forming agent as component (D) is a substance with an effect of forming a protective film on the copper surface, and it is also referred to as an "anticorrosive" or "inhibitor". However, it is believed that the protective film-forming agent constitutes a "reaction layer" that is removed as polishing progresses, and it is not necessary to form a "protective film" to prevent polishing of copper.

Component (D) is sufficiently water-soluble so that an effective amount will dissolve to exhibit the effect of addition of the protective film-forming agent, and substances known in the prior art may be used without any particular restrictions. Examples for component (D) include protective film-forming agents such as quinaldinic acid, anthranilic acid, salicylaldoxime, thiazole compounds, triazole compounds, imidazole compounds, pyrazole compounds and tetrazole compounds, with triazole compounds being preferred among these. Component (D) may be used as a single compound alone or a combination of two or more compounds.

A thiazole compound is a compound having a thiazole backbone in the molecule, and specific examples include 2-mercaptobenzothiazole.

A triazole compound is a compound having a triazole backbone in the molecule, and specific examples include 1,2,3-triazole; 1,2,4-triazole;

Triazole derivatives such as 3-amino-1H-1,2,4-triazole; benzotriazole; benzotriazole derivatives such as 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazole butyl ester, 4-carboxyl-1H-benzotriazole octyl ester, 5-hexylbenzotriazole, [1,2,3-benzotriazolyl-1-methyl] [1,2,4-triazolyl-1-methyl] [2-ethylhexyl]amine, tolyltriazole (alternate name: 5-methyl-1H-benzotriazole) and bis[(1-benzotriazolyl)methyl]phosphonic acid;

naphthotriazole;

and naphthotriazole derivatives such as 2-methylnaphthotriazole.

Preferred among these are at least one type selected from among benzotriazole and benzotriazole derivatives, from the viewpoint of superior balance between polishing rate and corrosion resistance.

An imidazole compound is a compound with an imidazole backbone in the molecule, and specific examples include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole and 2-aminoimidazole.

A pyrazole compound is a compound with a pyrazole backbone in the molecule, and specific examples include 3,5-dimethylpyrazole, 3-amino-5-methylpyrazole, 4-methylpyrazole and 3-amino-5-hydroxypyrazole.

A tetrazole compound is a compound with a tetrazole backbone in the molecule, and specific examples include 1H-tetrazole, 5-amino-1H-tetrazole, 5-methyl-1H-tetrazole, 5-phenyl-1H-tetrazole and 1-(2-diaminoethyl)-5-mercaptotetrazole.

The content of component (D) is 0.10 mass % or greater, preferably 0.11 mass % or greater and more preferably 0.12 mass % or greater based on the entire polishing solution, from the viewpoint of allowing the etching rate to be reduced while improving the polishing rate. Since the etching rate will tend not to be reduced beyond a certain point even with addition of component (D) to above a certain amount, the content is preferably not greater than 2.00 mass % and more preferably not greater than 1.50 mass % based on the entire polishing solution, from the viewpoint of minimizing the amount of component (D) used.

The present inventors have found that limiting the content of component (A) to a specific range with respect to the content of component (D) as the protective film-forming component is effective for achieving both an effect of inhibiting pad stains and an effect of improving polishing rate. Increasing the content of component (D) tends to increase the amount of insoluble complexes generated from component (D). When the content of component (D) is increased, therefore, it is necessary to also increase the content of component (A). The ratio of the content of component (A) with respect to the content of component (D) (mass ratio, calculated as "content of component (A) (mass %)/content of component (D) (mass %)") is at least 1.5, preferably at least 1.7, more preferably at least 2.0 and especially preferably at least 2.5, from the viewpoint of obtaining an excellent pad stain-inhibiting effect and polishing rate-improving effect, as well as from the viewpoint of limiting the amount of component (D) used, considering that the etching rate will tend not to be further reduced beyond a certain point even with addition of component (D) to the polishing solution above a certain amount. Also, from the viewpoint of limiting the amount of component (A) used, considering that the pad stain-inhibiting effect will tend not to improve beyond a certain point even with addition of component (A) to the polishing solution above a certain amount, the ratio is preferably not greater than 15.0, more preferably not greater than 10.0 and even more preferably not greater than 8.0.

(Component (E): Abrasive grain)

Component (E) is not particularly restricted, and examples include inorganic material abrasive grains comprising silica, alumina, zirconia, ceria, titania, silicon carbide or the like; and organic material abrasive grains comprising polystyrene, polyacryl, polyvinyl chloride or the like. Among these, silica and alumina are preferred for satisfactory dispersion stability in polishing solutions and low frequency of polishing scratches (scratches) formed by CMP, while colloidal silica and colloidal alumina are more preferred, and colloidal silica is even more preferred, from the viewpoint of easy mean particle size control and greater excellence in terms of polishing properties. Hydrolysis of silicon alkoxides or ion-exchange of sodium silicate are known methods for production of colloidal silica. Hydrolysis of aluminum nitrate is a known method for production of colloidal alumina. Component (E) may be used as a single compound or as a combination of two or more compounds.

The mean particle size of the abrasive grain is preferably not greater than 100 nm and more preferably not greater than 80 nm, from the viewpoint of allowing higher levels to be achieved for both polishing rate and surface flatness. Component (E) is more preferably an abrasive grain comprising at least one type selected from among colloidal silica and colloidal alumina while the mean particle size of the abrasive grain is not greater than 100 nm. The lower limit for the mean particle size of the abrasive grain is not particularly restricted and may be 10 nm, for example. The mean particle size of the abrasive grain is the mean particle size in the polishing solution, and it is the D50 value (the median diameter of the volume distribution, the cumulative median), obtained by measuring the polishing solution with a laser diffraction-type particle size distribution meter (for example, a COULTER N4 SD (trade name) by COULTER Electronics). Generally, when using an abrasive grain comprising at least one type selected from among colloidal silica and colloidal alumina, the mean particle size measured in a state of the colloidal silica or colloidal alumina is approximately the same as its mean particle size when mixed with other components to form a polishing solution.

The content of component (E) is preferably 0.10 mass % or greater and more preferably 0.20 mass % or greater based on the entire polishing solution, from the viewpoint of obtaining a sufficient physical grinding effect and further increasing the polishing rate. Also, since the polishing rate will tend not to increase beyond a certain point even with addition of component (E) to the polishing solution above a certain amount, the content of component (E) is preferably not greater than 10.0 mass % and more preferably not greater than 5.00 mass % based on the entire polishing solution, from the viewpoint of minimizing the amount of component (E) used and inhibiting abrasive grain aggregation and polishing scratches.

(Component (F): Oxidizing agent)

Component (F) may be used without any particular restrictions so long as it is an oxidizing agent having an oxidizing effect on copper. Examples of oxidizing agents include hydrogen peroxide ($H_2O_2$), persulfuric acid, persulfuric acid salt, periodic acid, periodic acid salts, iodic acid salts and bromic acid salts. Salts may be potassium salts and ammonium salts (for example, ammonium persulfate, potassium persulfate and potassium periodate). Preferred are at least one type selected from among hydrogen peroxide, persulfuric acid and persulfuric acid salts, from the viewpoint of obtaining a more superior polishing rate. Component (F) may be used as a single compound or as a combination of two or more compounds.

The content of component (F) is preferably 0.10 mass % or greater and more preferably 0.20 mass % or greater based on the entire polishing solution, from the viewpoint of more easily obtaining a satisfactory polishing rate. An excess of component (F) may not improve and instead may lower the polishing rate. The content of component (F) is therefore preferably not greater than 25.0 mass % and more preferably not greater than 20.0 mass % based on the entire polishing solution, from the viewpoint of limiting increase in the content of component (F) while further improving the polishing rate.

(Component (G): Water)

There are no particular restrictions on component (G) used as the medium for the polishing solution, but deionized water, ion-exchanged water or ultrapure water is preferred. The content of component (G) in the polishing solution may be the remainder after the content of the other components mentioned above, and it is not particularly restricted so long as it is present in the polishing solution. The polishing solution may further comprise a solvent other than water, if necessary, which may be a polar solvent such as ethanol or acetone.

The polishing solution may further comprise materials commonly used in CMP polishing solutions, such as dispersing agents or coloring agents, in addition to the components mentioned above, in ranges that do not interfere with the function and effect of the polishing solution.

(Polishing Method)

The polishing method of this embodiment comprises a polishing step in which a copper-containing metal film is polished using a polishing solution of this embodiment to remove at least a portion of the metal film. In the polishing step, for example, while supplying the polishing solution between an abrasive cloth and a metal film of a substrate having the metal film on the surface (for example, the principal surface), as the film to be polished, the metal film is polished by relatively moving the substrate and abrasive cloth in a state that the metal film of the substrate is pressed against the surface of the abrasive cloth, to remove at least a portion of the metal film.

The polishing solution of this embodiment has a much higher polishing rate for copper-containing metal films compared to a conventional polishing solution for copper polishing, and for example, it is especially and suitably used for polishing of a thick metal film in a process for production of high performance microcircuit boards, such as LSIs or other package boards. More specifically, it is especially and suitably used for polishing of a substrate on which the copper-containing metal film to be polished has a thicknesses of 4 μm or greater, for example. With this embodiment, it is possible to provide a polishing solution for copper polishing that is suitable for use in CMP steps and that has a high polishing rate and polished smoothness, as well as a polishing method using the polishing solution.

According to this embodiment, there is provided the use of the polishing solution for polishing of a copper-containing metal film. This embodiment further provides the use of the polishing solution for polishing of a thick metal film (for example, a metal film of 4 μm or greater).

A Through Silicon Via (TSV)-forming step may be mentioned as a step necessary for polishing of very thick metal films. Various methods have been proposed as methods of forming TSVs, and a specific method is VIA-LAST, wherein vias are formed after forming the element. A method of using the polishing solution of this embodiment in a VIA-LAST process will now be explained with reference to the accompanying drawings.

Figure 1:
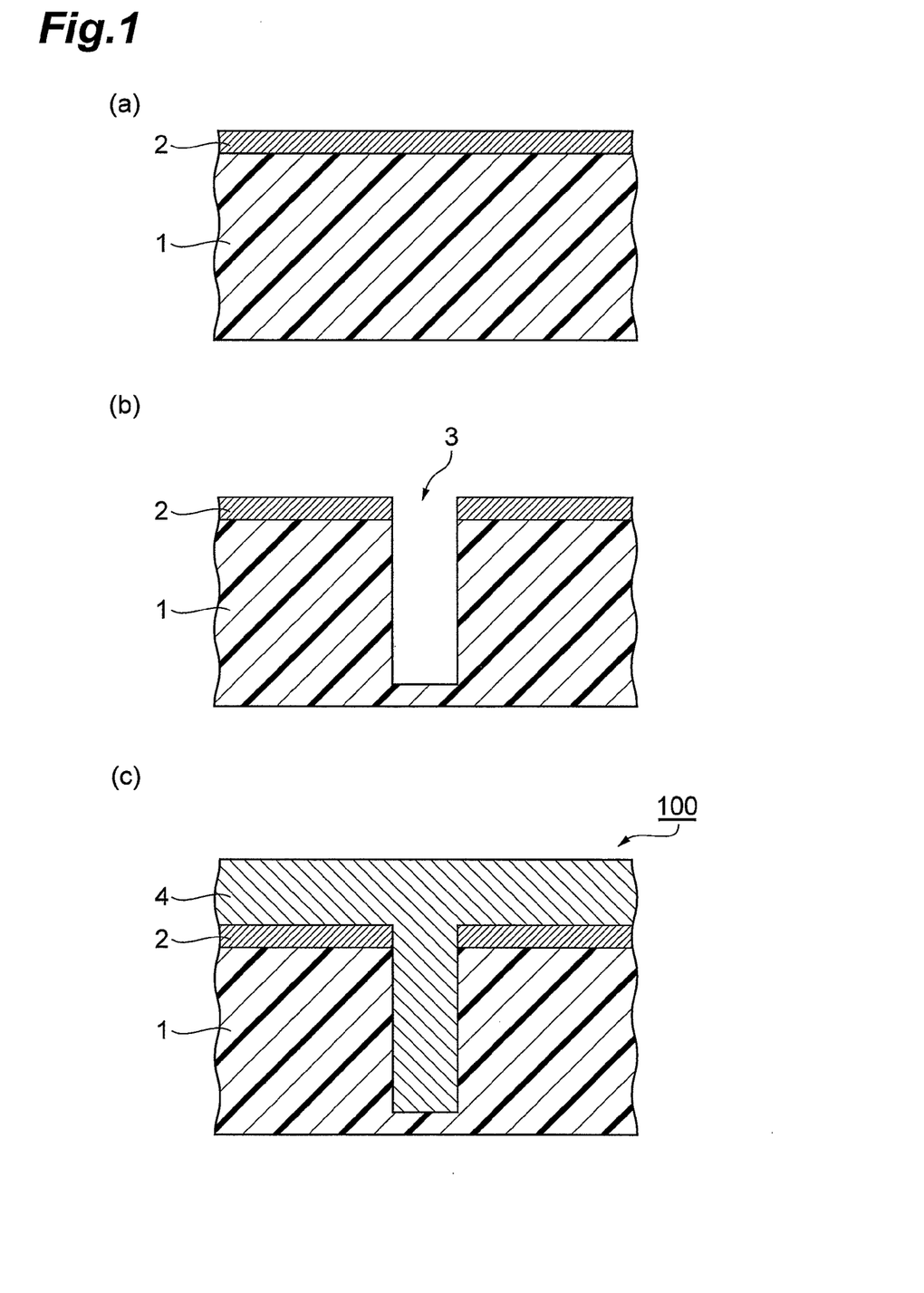
FIG. 1 is a schematic cross-sectional view showing a first step of the case wherein a polishing solution for copper polishing according to one embodiment of the invention is used for VIA-LAST.

FIG. 1 is a schematic cross-sectional view showing a first step of forming a copper film 4 on a silicon substrate 1. As shown in FIG. 1(a), an element 2 is formed at a prescribed location on the silicon substrate 1. Next, as shown in FIG. 1(b), a recess 3 for a through via is formed by a method such as plasma etching. Next, copper is laminated by a method such as sputtering or electrolytic plating so as to fill the recess 3, to form a copper film 4, thereby obtaining a substrate 100 having the structure shown in FIG. 1(c).

Figure 2:
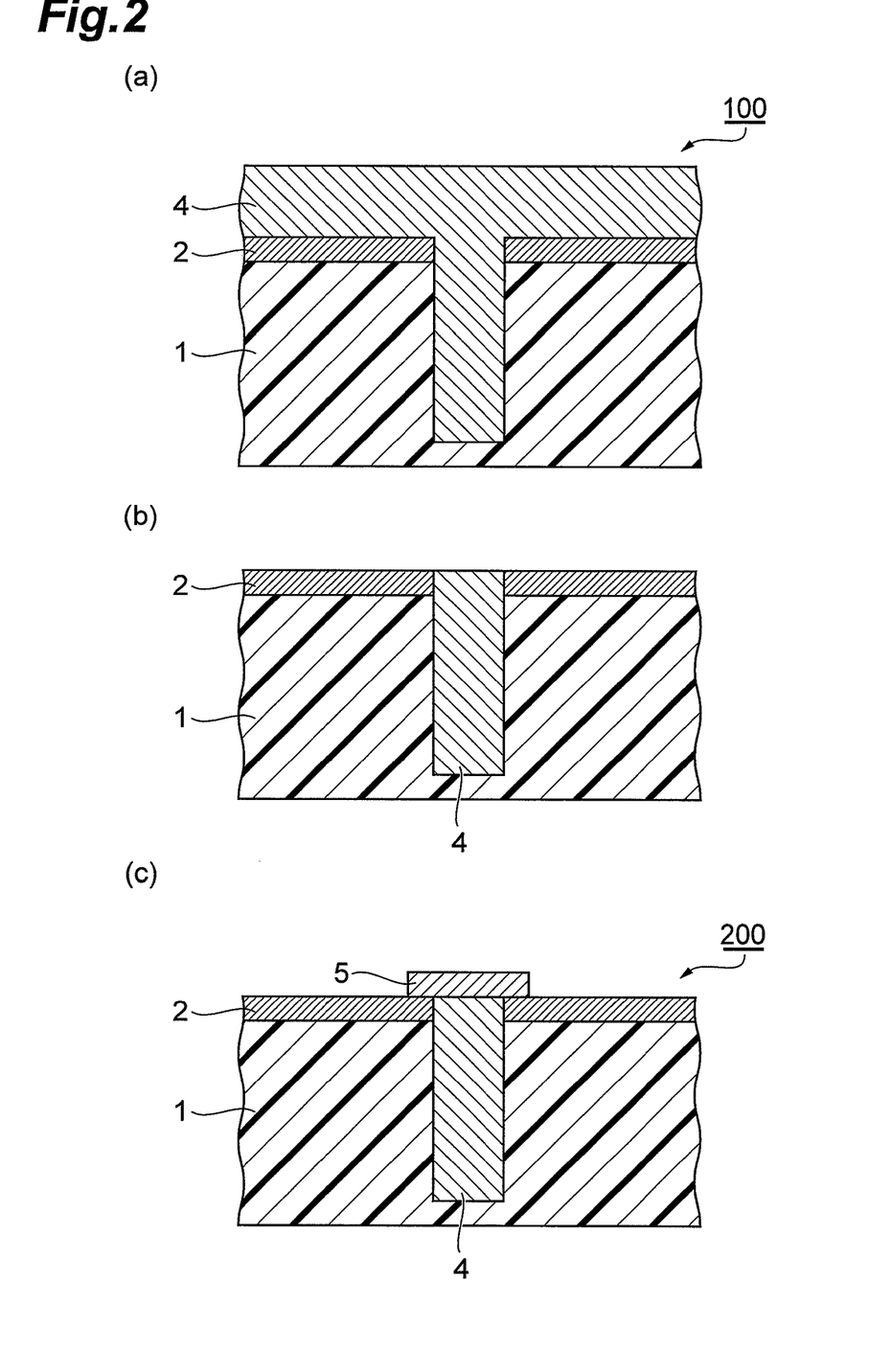
FIG. 2 is a schematic cross-sectional view showing a second step of the case wherein a polishing solution for copper polishing according to one embodiment of the invention is used for VIA-LAST.

FIG. 2 is a schematic cross-sectional view showing a second step of polishing a substrate 100 formed in this manner and forming a bump 5 on one surface. As shown in FIG. 2(b), the copper film 4 is polished until the element 2 is exposed, while supplying the polishing solution between the surface of the copper film 4 in FIG. 2(a) and a pad (not shown).

More specifically, while supplying the polishing solution between the copper film 4 of the substrate 100 and the surface of the pad of a polishing platen, the copper film 4 is polished by relatively moving the polishing platen and the substrate 100 in a state that the copper film 4 of the substrate 100 is pressed against the surface of the pad. A metal or resin brush may be used instead of a pad. The polishing may also be accomplished by spraying the polishing solution at a prescribed pressure.

In the case of polishing with a pad, for example, the polishing apparatus used may be a common polishing apparatus having a polishing platen that is connected to a motor or the like with variable rotational speed and that can mount the pad, and a holder capable of holding the substrate to be polished. There are no particular restrictions on the pad, and a common nonwoven fabric, foamed polyurethane, porous fluorine resin or the like may be used.

The polishing conditions are not restricted, but the rotational speed of the polishing platen is preferably low, at not higher than 200 rpm, to prevent fly off of the substrate. The pressure (polishing pressure) with which the substrate having the surface to be polished is pressed against the pad is preferably 1-100 kPa, and it is more preferably 5-50 kPa for improving uniformity of CMP rate within the surface to be polished and flatness of the pattern. During the polishing, the polishing solution may be continuously supplied to the pad with a pump or the like. The amount supplied is not particularly restricted, but preferably the surface of the pad is covered by the polishing solution at all times.

Upon completion of polishing, preferably, the substrate is thoroughly rinsed in running water and is dried after removing the water droplets adhering to the substrate using spin dry or the like. For CMP with a consistent surface condition of the pad, it is preferred to include a pad-conditioning step before polishing. For example, the pad is conditioned with a solution containing at least water, using a dresser with diamond particles. Preferably, a CMP polishing step is subsequently carried out using the polishing solution of this embodiment, and then a substrate-washing step is carried out.

Next, as shown in FIG. 2(c), the exposed surface portion of the copper film 4 is subjected to electrolytic plating or the like to form a bump 5, to obtain a substrate 200 having a bump 5 on one surface. The material of the bump 5 may be copper or the like.

Figure 3:
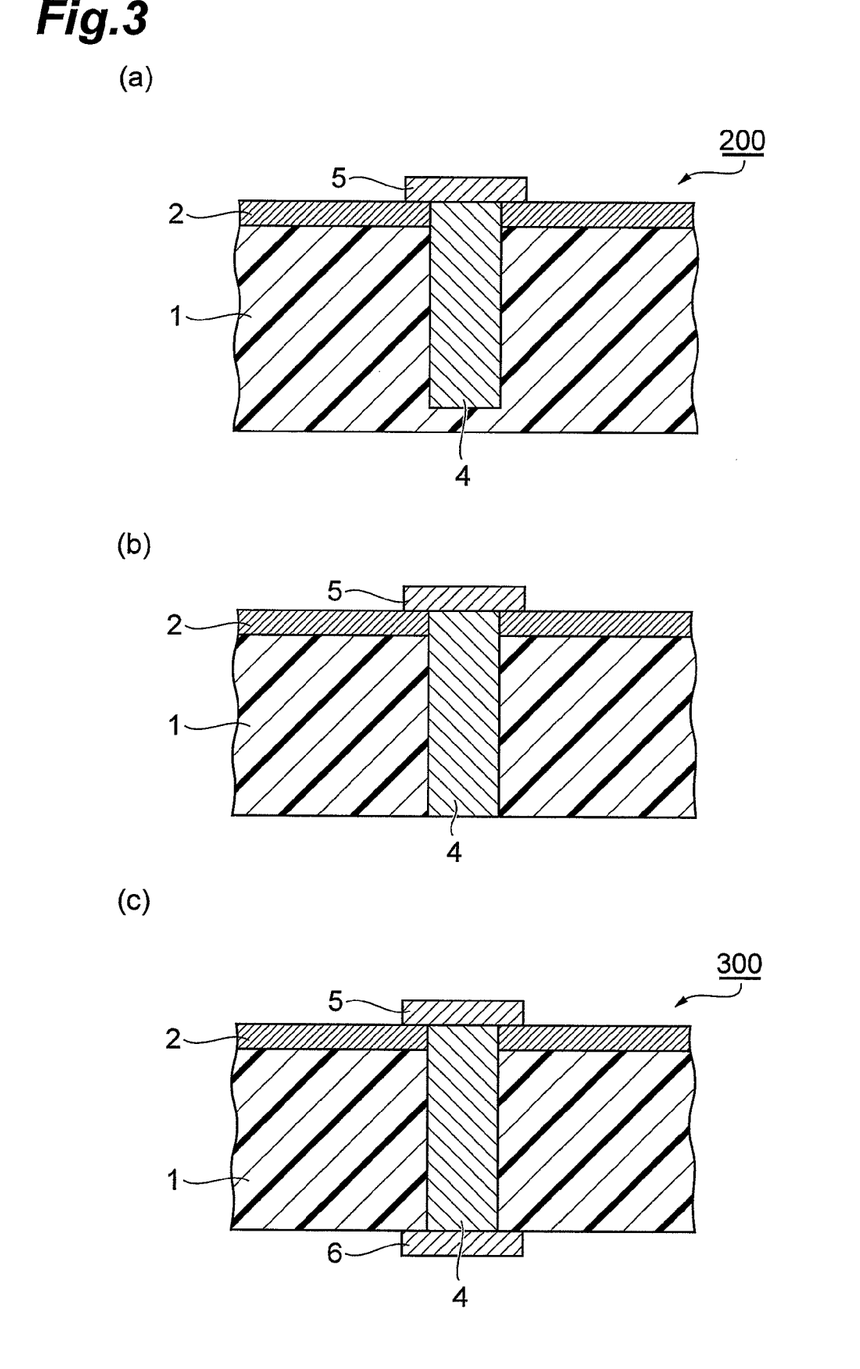
FIG. 3 is a schematic cross-sectional view showing a third step of the case wherein a polishing solution for copper polishing according to one embodiment of the invention is used for VIA-LAST.

FIG. 3 is a schematic cross-sectional view showing a third step of forming a bump 6 on the other surface. In the substrate 200 as shown in FIG. 3(a), the surface of the silicon substrate 1 on which the bump 5 is not formed (the surface opposite to the surface on which the bump 5 is formed) is polished by a method such as CMP to expose the copper film 4 (FIG. 3(b)). Next, a bump 6 is formed by the same method as the method of forming the bump 5. As a result, a TSV-formed substrate 300 is obtained (FIG. 3(c)).

EXAMPLES

The present invention will now be explained in greater detail through the following examples, with the understanding that the invention is in no way limited by the examples. Unless otherwise specified, the "%" values refer to "mass %".

(Preparation of Polishing Solutions)

Example 1

To 600 g of purified water there were added 6.4 g of 85% concentration phosphoric acid, 13.3 g of glycine, 1.9 g of benzotriazole, 10.7 g of citric acid and 50 g of colloidal silica with a mean particle size of 70 nm (abrasive grain content: 20%) as an abrasive grain, the components other than colloidal silica were dissolved, and purified water was further added so as to be a total mass of 700 g. To this there was added 300 g of hydrogen peroxide water (reagent grade, 30% aqueous solution) to obtain polishing solution 1 with a total mass of 1000 g.

Example 2

Polishing solution 2 was prepared in the same manner as Example 1, except that the 10.7 g of citric acid was changed to 10.7 g of malic acid.

Example 3

Polishing solution 3 was prepared in the same manner as Example 1, except that the 10.7 g of citric acid was changed to 10.7 g of glycolic acid.

Example 4

Polishing solution 4 was prepared in the same manner as Example 1, except that the 10.7 g of citric acid was changed to 5.3 g of citric acid and 5.3 g of oxalic acid, and the amount of purified water added was adjusted to a total mass of 1000 g.

Example 5

Polishing solution 5 was prepared in the same manner as Example 1, except that the 10.7 g of citric acid was changed to 5.3 g of citric acid and 5.3 g of maleic acid, and the amount of purified water added was adjusted to a total mass of 1000 g.

Example 6

Polishing solution 6 was prepared in the same manner as Example 1, except that the amount of citric acid added was changed to 5.3 g, and the amount of purified water added was adjusted to a total mass of 1000 g.

Example 7

Polishing solution 7 was prepared in the same manner as Example 1, except that the amount of 85% concentration phosphoric acid added was changed to 3.2 g, and the amount of purified water added was adjusted to a total mass of 1000 g.

Example 8

To 600 g of purified water there were added 6.4 g of 85% concentration phosphoric acid, 10.7 g of glycine, 1.9 g of benzotriazole, 10.7 g of citric acid and 50 g of colloidal silica with a mean particle size of 70 nm (abrasive grain content: 20%) as an abrasive grain, the components other than colloidal silica were dissolved, and purified water was further added so as to be a total mass of 690 g. To this there was added 300 g of hydrogen peroxide water (reagent grade, 30% aqueous solution) so as to be a total mass of 990 g, and then 25% concentration ammonia water was added to adjust the pH of the polishing solution to 2.4. The remaining purified water was then added to prepare polishing solution 8 with a total mass of 1000 g. The final pH of the polishing solution was confirmed to be 2.4.

Example 9

To 600 g of purified water there were added 6.4 g of 85% concentration phosphoric acid, 5.3 g of glycine, 1.9 g of benzotriazole, 10.7 g of citric acid and 50 g of colloidal silica with a mean particle size of 70 nm (abrasive grain content: 20%) as an abrasive grain, the components other than colloidal silica were dissolved, and purified water was further added so as to be a total mass of 690 g. To this there was added 300 g of hydrogen peroxide water (reagent grade, 30% aqueous solution) so as to be a total mass of 990 g, and then 25% concentration ammonia water was added to adjust the pH of the polishing solution to 2.4. The remaining purified water was then added to prepare polishing solution 9 with a total mass of 1000 g. The fmal pH of the polishing solution was confirmed to be 2.4.

Example 10

Polishing solution 10 was prepared in the same manner as Example 1, except that the amount of benzotriazole added was changed to 1.3 g, and the amount of purified water added was adjusted to a total mass of 1000 g.

Example 11

Polishing solution 11 was prepared in the same manner as Example 1, except that the amount of benzotriazole added was changed to 2.7 g, and the amount of purified water added was adjusted to a total mass of 1000 g.

Example 12

Polishing solution 12 was prepared in the same manner as Example 1, except that the 5.4 g of 85% concentration phosphoric acid was changed to 5.8 g of 96% concentration sulfuric acid, and the amount of purified water added was adjusted to a total mass of 1000 g.

Example 13

Polishing solution 13 was prepared in the same manner as Example 1, except that the 13.3 g of glycine was changed to 13.3 g of alanine.

Example 14

Polishing solution 14 was prepared in the same manner as Example 1, except that the 1.9 g of benzotriazole was changed to 1.3 g of 5-methylbenzotriazole (tolyltriazole), and the amount of purified water added was adjusted to a total mass of 1000 g.

Example 15

Polishing solution 15 was prepared in the same manner as Example 1, except that the amount of benzotriazole added was changed to 1.3 g, the amount of citric acid added was changed to 2.5 g, 8.2 g of maleic acid was added, and the amount of purified water added was adjusted to a total mass of 1000 g.

Comparative Example 1

To 600 g of purified water there were added 6.4 g of 85% concentration phosphoric acid, 13.3 g of glycine, 1.9 g of benzotriazole, and 50 g of colloidal silica with a mean particle size of 70 nm (abrasive grain content: 20%) as an abrasive grain, the components other than colloidal silica were dissolved, and purified water was further added so as to be a total mass of 700 g. To this there was added 300 g of hydrogen peroxide water (reagent grade, 30% aqueous solution) to obtain polishing solution X1 with a total mass of 1000 g.

Comparative Example 2

Polishing solution X2 was prepared in the same manner as Comparative Example 1, except that the amount of 85% concentration phosphoric acid added was changed to 1.65 g, 10.7 g of citric acid was added, and the amount of purified water added was adjusted to a total mass of 1000 g.

Comparative Example 3

Polishing solution X3 was prepared in the same manner as Comparative Example 1, except that the amount of 85% concentration phosphoric acid added was changed to 0.24 g, 10.7 g of citric acid was added, and the amount of purified water added was adjusted to a total mass of 1000 g.

Comparative Example 4

To 600 g of purified water there were added 6.4 g of 85% concentration phosphoric acid, 2.7 g of glycine, 1.9 g of benzotriazole, 10.7 g of citric acid and 50 g of colloidal silica with a mean particle size of 70 nm (abrasive grain content: 20%) as an abrasive grain, the components other than colloidal silica were dissolved, and purified water was further added so as to be a total mass of 690 g. To this there was added 300 g of hydrogen peroxide water (reagent grade, 30% aqueous solution) so as to be a total mass of 990 g, and then 25% concentration ammonia water was added to adjust the pH of the polishing solution to 2.4. The remaining purified water was then added to prepare polishing solution X4 with a total mass of 1000 g. The final pH of the polishing solution was confirmed to be 2.4.

Comparative Example 5

To 600 g of purified water there were added 6.4 g of 85% concentration phosphoric acid, 1.9 g of benzotriazole, 10.7 g of citric acid and 50 g of colloidal silica with a mean particle size of 70 nm (abrasive grain content: 20%) as an abrasive grain, the components other than colloidal silica were dissolved, and purified water was further added so as to be a total mass of 690 g. To this there was added 300 g of hydrogen peroxide water (reagent grade, 30% aqueous solution) so as to be a total mass of 990 g, and then 25% concentration ammonia water was added to adjust the pH of the polishing solution to 2.4. The remaining purified water was then added to prepare polishing solution X5 with a total mass of 1000 g. The final pH of the polishing solution was confirmed to be 2.4.

Comparative Example 6

Polishing solution X6 was prepared in the same manner as Comparative Example 1, except that no benzotriazole was added, 10.7 g of citric acid was added, and the amount of purified water added was adjusted to a total mass of 1000 g.

Comparative Example 7

Polishing solution X7 was prepared in the same manner as Comparative Example 1, except that the amount of benzotriazole added was changed to 0.3 g, 10.7 g of citric acid was added, and the amount of purified water added was adjusted to a total mass of 1000 g.

Comparative Example 8

Polishing solution X8 was prepared in the same manner as Comparative Example 1, except that the amount of benzotriazole added was changed to 0.8 g, 10.7 g of citric acid was added, and the amount of purified water added was adjusted to a total mass of 1000 g.

Comparative Example 9

Polishing solution X9 was prepared in the same manner as Comparative Example 1, except that the amount of benzotriazole added was changed to 3.7 g, 5.3 g of citric acid was added, and the amount of purified water added was adjusted to a total mass of 1000 g.

Comparative Example 10

Polishing solution X10 was prepared in the same manner as Comparative Example 1, except that 2.7 g of citric acid was added, and the amount of purified water added was adjusted to a total mass of 1000 g.

Comparative Example 11

Polishing solution X11 was prepared in the same manner as Comparative Example 1, except that 10.7 g of oxalic acid was added, and the amount of purified water added was adjusted to a total mass of 1000 g.

Comparative Example 12

Polishing solution X12 was prepared in the same manner as Comparative Example 1, except that 10.7 g of malonic acid was added, and the amount of purified water added was adjusted to a total mass of 1000 g.

Comparative Example 13

Polishing solution X13 was prepared in the same manner as Comparative Example 1, except that 10.7 g of maleic acid was added, and the amount of purified water added was adjusted to a total mass of 1000 g.

Comparative Example 14

Polishing solution X14 was prepared in the same manner as Comparative Example 1, except that 10.7 g of acetic acid was added, and the amount of purified water added was adjusted to a total mass of 1000 g.

(Measurement of Polishing Solution pH)

The pH values of polishing solutions 1 to 15 and X1 to X14 were measured using a Model PH81 by Yokogawa Electric Corp.

(Etching Rate Measurement)

A copper film-formed measuring substrate was dipped in the stirred polishing solution (room temperature (25° C.), 600 rpm stirring), and the difference in thickness of the copper film before and after dipping was calculated from the electrical resistance value. The measuring substrate used was a 2 cm×2 cm chip obtained by cutting a substrate (by Global Net Corp.) comprising a 20 μm-thick copper film formed on a silicon substrate with an 8-inch diameter (20 cm) (φ). The liquid volume of the polishing solution was 100 ml. The etching rate was calculated by dividing the difference in thickness of the copper film by the dipping time (min).

(Measurement of Polishing Rate)

A substrate (by Global Net Corp.) comprising a 20 μm-thick copper film formed on a silicon substrate with an 8-inch diameter (20 cm) (φ) was prepared. The substrate was used for CMP polishing while adding polishing solutions 1 to 15 and polishing solutions X1 to X5 and X9 to 14 dropwise to the pad attached to the platen of the polishing apparatus.

The polishing rate was not measured for polishing solutions X6 to X8, which had extremely high etching rates.

The polishing conditions were as follows.
Polishing apparatus: CMP polishing machine (trade name: Mirra by Applied Materials, Inc.)
Pad: Foamed polyurethane resin with closed cells (trade name: IC-1010 by Rohm & Haas)
Polishing pressure: 32 kPa
Platen/head rotational speed: 110/105 rpm
Polishing solution flow rate: 200 ml/min The polishing rate was calculated in the following manner. First, a VR-120 (trade name) metal film thickness meter by Hitachi Kokusai Engineering Co., Ltd. was used for measurement of the sheet resistance at 81 locations on the copper film surface at equal spacings (approximately 2.4 mm spacings) in the diameter direction of the substrate, and the average values for the sheet resistance were calculated before and after CMP polishing. Also, the difference in film thickness of the copper film before and after CMP polishing was determined by calculation from the difference in the average value of the sheet resistance before and after polishing, and the polishing rate was calculated by dividing the difference in film thickness by the polishing time (min).

(Pad Stain Evaluation)

The condition of pads was visually observed after polishing rate measurement, and the presence of pad stains was evaluated.

The constituent components of polishing solutions 1 to 15 and X1 to X14, the pH of each polishing solution, and the results of etching rate measurement, polishing rate measurement and pad stain evaluation, are shown in Tables 1 to 4. The "chemical components" do not include ammonia, which is not treated as component (B). For the pad stain evaluations in Tables 1 to 4, "A" indicates that no pad stains were formed, and "B" indicates that pad stains were formed.

TABLE 1

| Component name | Substance name | Units | Example | | | | | | |
|---|---|---|---|---|---|---|---|---|---|
| | | | 1 | 2 | 3 | 4 | 5 | 6 | 7 |
| (E) Abrasive grain | Colloidal silica | mass % | 1.00 | 1.00 | 1.00 | 1.00 | 1.00 | 1.00 | 1.00 |
| (B) Inorganic acid | Sulfuric acid | mass % | 0.00 | 0.00 | 0.00 | 0.00 | 0.00 | 0.00 | 0.00 |
| | Phosphoric acid | mass % | 0.54 | 0.54 | 0.54 | 0.54 | 0.54 | 0.54 | 0.27 |
| (C) Amino acid | Glycine | mass % | 1.33 | 1.33 | 1.33 | 1.33 | 1.33 | 1.33 | 1.33 |
| | Alanine | mass % | 0.00 | 0.00 | 0.00 | 0.00 | 0.00 | 0.00 | 0.00 |
| (D) Protective film-forming agent | Benzotriazole | mass % | 0.19 | 0.19 | 0.19 | 0.19 | 0.19 | 0.19 | 0.19 |
| | Tolyltriazole | mass % | 0.00 | 0.00 | 0.00 | 0.00 | 0.00 | 0.00 | 0.00 |
| (A) Organic acid containing hydroxyl group | Citric acid | mass % | 1.07 | 0.00 | 0.00 | 0.53 | 0.53 | 0.53 | 1.07 |
| | Malic acid | mass % | 0.00 | 1.07 | 0.00 | 0.00 | 0.00 | 0.00 | 0.00 |
| | Glycolic acid | mass % | 0.00 | 0.00 | 1.07 | 0.00 | 0.00 | 0.00 | 0.00 |
| (H) Organic acid containing no hydroxyl group | Oxalic acid (pKa1 = 1.04) | mass % | 0.00 | 0.00 | 0.00 | 0.53 | 0.00 | 0.00 | 0.00 |
| | Malonic acid (pKa1 = 2.65) | mass % | 0.00 | 0.00 | 0.00 | 0.00 | 0.00 | 0.00 | 0.00 |
| | Maleic acid (pKa1 = 1.75) | mass % | 0.00 | 0.00 | 0.00 | 0.00 | 0.53 | 0.00 | 0.00 |
| | Acetic acid (pKa1 = 4.56) | mass % | 0.00 | 0.00 | 0.00 | 0.00 | 0.00 | 0.00 | 0.00 |
| (F) Oxidizing agent | Hydrogen peroxide | mass % | 9.00 | 9.00 | 9.00 | 9.00 | 9.00 | 9.00 | 9.00 |
| pH Regulator | Ammonia | — | — | — | — | — | — | — | — |
| Component (B) total | | mass % | 0.54 | 0.54 | 0.54 | 0.54 | 0.54 | 0.54 | 0.27 |
| Component (C) total | | mass % | 1.33 | 1.33 | 1.33 | 1.33 | 1.33 | 1.33 | 1.33 |
| Component (D) total | | mass % | 0.19 | 0.19 | 0.19 | 0.19 | 0.19 | 0.19 | 0.19 |

TABLE 1-continued

| Component name | Substance name | Units | Example 1 | 2 | 3 | 4 | 5 | 6 | 7 |
|---|---|---|---|---|---|---|---|---|---|
| Component (A) total | | mass % | 1.07 | 1.07 | 1.07 | 0.53 | 0.53 | 0.53 | 1.07 |
| Component (H) total | | mass % | 0.00 | 0.00 | 0.00 | 0.53 | 0.53 | 0.00 | 0.00 |
| Chemical component total | | mass % | 3.13 | 3.13 | 3.13 | 3.12 | 3.12 | 2.59 | 2.86 |
| Component (A) + component (H) total | | mass % | 1.07 | 1.07 | 1.07 | 1.06 | 1.06 | 0.53 | 1.07 |
| Component (A)/component (D) (mass ratio) | | — | 5.63 | 5.63 | 5.63 | 2.79 | 2.79 | 2.79 | 5.63 |
| pH | | — | 2.4 | 2.6 | 2.8 | 2.4 | 2.4 | 2.5 | 2.5 |
| Etching rate | | Å/min | 500 | 470 | 450 | 510 | 540 | 460 | 550 |
| Polishing rate | | Å/min | 40000 | 39000 | 38000 | 44000 | 46000 | 31000 | 39000 |
| Pad stains | | — | A | A | A | A | A | A | A |

TABLE 2

| Component name | Substance name | Units | Example 8 | 9 | 10 | 11 | 12 | 13 | 14 | 15 |
|---|---|---|---|---|---|---|---|---|---|---|
| (E) Abrasive grain | Colloidal silica | mass % | 1.00 | 1.00 | 1.00 | 1.00 | 1.00 | 1.00 | 1.00 | 1.00 |
| (B) Inorganic acid | Sulfuric acid | mass % | 0.00 | 0.00 | 0.00 | 0.00 | 0.56 | 0.00 | 0.00 | 0.00 |
| | Phosphoric acid | mass % | 0.54 | 0.54 | 0.54 | 0.54 | 0.00 | 0.54 | 0.54 | 0.54 |
| (C) Amino acid | Glycine | mass % | 1.07 | 0.53 | 1.33 | 1.33 | 1.33 | 0.00 | 1.33 | 1.33 |
| | Alanine | mass % | 0.00 | 0.00 | 0.00 | 0.00 | 0.00 | 1.33 | 0.00 | 0.00 |
| (D) Protective film-forming agent | Benzotriazole | mass % | 0.19 | 0.19 | 0.13 | 0.27 | 0.19 | 0.19 | 0.00 | 0.13 |
| | Tolyltriazole | mass % | 0.00 | 0.00 | 0.00 | 0.00 | 0.00 | 0.00 | 0.13 | 0.00 |
| (A) Organic acid containing hydroxyl group | Citric acid | mass % | 1.07 | 1.07 | 1.07 | 1.07 | 1.07 | 1.07 | 1.07 | 0.25 |
| | Malic acid | mass % | 0.00 | 0.00 | 0.00 | 0.00 | 0.00 | 0.00 | 0.00 | 0.00 |
| | Glycolic acid | mass % | 0.00 | 0.00 | 0.00 | 0.00 | 0.00 | 0.00 | 0.00 | 0.00 |
| (H) Organic acid containing no hydroxyl group | Oxalic acid (pKa1 = 1.04) | mass % | 0.00 | 0.00 | 0.00 | 0.00 | 0.00 | 0.00 | 0.00 | 0.00 |
| | Malonic acid (pKa1 = 2.65) | mass % | 0.00 | 0.00 | 0.00 | 0.00 | 0.00 | 0.00 | 0.00 | 0.00 |
| | Maleic acid (pKa1 = 1.75) | mass % | 0.00 | 0.00 | 0.00 | 0.00 | 0.00 | 0.00 | 0.00 | 0.82 |
| | Acetic acid (pKa1 = 4.56) | mass % | 0.00 | 0.00 | 0.00 | 0.00 | 0.00 | 0.00 | 0.00 | 0.00 |
| (F) Oxidizing agent | Hydrogen peroxide | mass % | 9.00 | 9.00 | 9.00 | 9.00 | 9.00 | 9.00 | 9.00 | 9.00 |
| pH Regulator | Ammonia | — | q.s. | q.s. | — | — | — | — | — | — |
| Component (B) total | | mass % | 0.54 | 0.54 | 0.54 | 0.54 | 0.56 | 0.54 | 0.54 | 0.54 |
| Component (C) total | | mass % | 1.07 | 0.53 | 1.33 | 1.33 | 1.33 | 1.33 | 1.33 | 1.33 |
| Component (D) total | | mass % | 0.19 | 0.19 | 0.13 | 0.27 | 0.19 | 0.19 | 0.13 | 0.13 |
| Component (A) total | | mass % | 1.07 | 1.07 | 1.07 | 1.07 | 1.07 | 1.07 | 1.07 | 0.25 |
| Component (H) total | | mass % | 0.00 | 0.00 | 0.00 | 0.00 | 0.00 | 0.00 | 0.00 | 0.82 |
| Chemical component total | | mass % | 2.87 | 2.33 | 3.07 | 3.21 | 3.15 | 3.13 | 3.07 | 3.07 |
| Component (A) + component (H) total | | mass % | 1.07 | 1.07 | 1.07 | 1.07 | 1.07 | 1.07 | 1.07 | 1.07 |
| Component (A)/component (D) (mass ratio) | | — | 5.63 | 5.63 | 8.23 | 3.96 | 5.63 | 5.63 | 8.23 | 1.92 |
| pH | | — | 2.4 | 2.4 | 2.4 | 2.4 | 2.4 | 2.4 | 2.4 | 2.4 |
| Etching rate | | Å/min | 420 | 360 | 890 | 250 | 490 | 520 | 130 | 910 |
| Polishing rate | | Å/min | 40000 | 34000 | 46000 | 33000 | 48000 | 41000 | 38000 | 47000 |
| Pad stains | | — | A | A | A | A | A | A | A | A |

TABLE 3

| Component name | Substance name | Units | Comp. Ex. 1 | 2 | 3 | 4 | 5 | 6 | 7 |
|---|---|---|---|---|---|---|---|---|---|
| (E) Abrasive grain | Colloidal silica | mass % | 1.00 | 1.00 | 1.00 | 1.00 | 1.00 | 1.00 | 1.00 |
| (B) Inorganic acid | Sulfuric acid | mass % | 0.00 | 0.00 | 0.00 | 0.00 | 0.00 | 0.00 | 0.00 |
| | Phosphoric acid | mass % | 0.54 | 0.14 | 0.02 | 0.54 | 0.54 | 0.54 | 0.54 |
| (C) Amino acid | Glycine | mass % | 1.33 | 1.33 | 1.33 | 0.27 | 0.00 | 1.33 | 1.33 |
| | Alanine | mass % | 0.00 | 0.00 | 0.00 | 0.00 | 0.00 | 0.00 | 0.00 |

TABLE 3-continued

| Component name | Substance name | Units | Comp. Ex. 1 | 2 | 3 | 4 | 5 | 6 | 7 |
|---|---|---|---|---|---|---|---|---|---|
| (D) Protective film-forming agent | Benzotriazole | mass % | 0.19 | 0.19 | 0.19 | 0.19 | 0.19 | 0.00 | 0.03 |
|  | Tolyltriazole | mass % | 0.00 | 0.00 | 0.00 | 0.00 | 0.00 | 0.00 | 0.00 |
| (A) Organic acid containing hydroxyl group | Citric acid | mass % | 0.00 | 1.07 | 1.07 | 1.07 | 1.07 | 1.07 | 1.07 |
|  | Malic acid | mass % | 0.00 | 0.00 | 0.00 | 0.00 | 0.00 | 0.00 | 0.00 |
|  | Glycolic acid | mass % | 0.00 | 0.00 | 0.00 | 0.00 | 0.00 | 0.00 | 0.00 |
| (H) Organic acid containing no hydroxyl group | Oxalic acid (pKa1 = 1.04) | mass % | 0.00 | 0.00 | 0.00 | 0.00 | 0.00 | 0.00 | 0.00 |
|  | Malonic acid (pKa1 = 2.65) | mass % | 0.00 | 0.00 | 0.00 | 0.00 | 0.00 | 0.00 | 0.00 |
|  | Maleic acid (pKa1 = 1.75) | mass % | 0.00 | 0.00 | 0.00 | 0.00 | 0.00 | 0.00 | 0.00 |
|  | Acetic acid (pKa1 = 4.56) | mass % | 0.00 | 0.00 | 0.00 | 0.00 | 0.00 | 0.00 | 0.00 |
| (F) Oxidizing agent | Hydrogen peroxide | mass % | 9.00 | 9.00 | 9.00 | 9.00 | 9.00 | 9.00 | 9.00 |
| pH Regulator | Ammonia | — | — | — | — | — | q.s. | q.s. | — | — |
| Component (B) total |  | mass % | 0.54 | 0.14 | 0.02 | 0.54 | 0.54 | 0.54 | 0.54 |
| Component (C) total |  | mass % | 1.33 | 1.33 | 1.33 | 0.27 | 0.00 | 1.33 | 1.33 |
| Component (D) total |  | mass % | 0.19 | 0.19 | 0.19 | 0.19 | 0.19 | 0.00 | 0.03 |
| Component (A) total |  | mass % | 0.00 | 1.07 | 1.07 | 1.07 | 1.07 | 1.07 | 1.07 |
| Component (H) total |  | mass % | 0.00 | 0.00 | 0.00 | 0.00 | 0.00 | 0.00 | 0.00 |
| Chemical component total |  | mass % | 2.06 | 2.73 | 2.61 | 2.07 | 1.80 | 2.94 | 2.97 |
| Component (A) + component (H) total |  | mass % | 0.00 | 1.07 | 1.07 | 1.07 | 1.07 | 1.07 | 1.07 |
| Component (A)/component (D) (mass ratio) |  | — | 0.00 | 5.63 | 5.63 | 5.63 | 5.63 | — | 35.67 |
| pH |  | — | 2.6 | 2.6 | 2.7 | 2.4 | 2.4 | 2.4 | 2.4 |
| Etching rate |  | Å/min | 440 | 600 | 630 | 340 | 320 | >1500 | >1500 |
| Polishing rate |  | Å/min | 14000 | 9000 | 5000 | 26000 | 19000 | — | — |
| Pad stains |  | — | B | A | A | A | A | — | — |

TABLE 4

| Component name | Substance name | Units | Comp. Ex. 8 | 9 | 10 | 11 | 12 | 13 | 14 |
|---|---|---|---|---|---|---|---|---|---|
| (E) Abrasive grain | Colloidal silica | mass % | 1.00 | 1.00 | 1.00 | 1.00 | 1.00 | 1.00 | 1.00 |
| (B) Inorganic acid | Sulfuric acid | mass % | 0.00 | 0.00 | 0.00 | 0.00 | 0.00 | 0.00 | 0.00 |
|  | Phosphoric acid | mass % | 0.54 | 0.54 | 0.54 | 0.54 | 0.54 | 0.54 | 0.54 |
| (C) Amino acid | Glycine | mass % | 1.33 | 1.33 | 1.33 | 1.33 | 1.33 | 1.33 | 1.33 |
|  | Alanine | mass % | 0.00 | 0.00 | 0.00 | 0.00 | 0.00 | 0.00 | 0.00 |
| (D) Protective film-forming agent | Benzotriazole | mass % | 0.08 | 0.37 | 0.19 | 0.19 | 0.19 | 0.19 | 0.19 |
|  | Tolyltriazole | mass % | 0.00 | 0.00 | 0.00 | 0.00 | 0.00 | 0.00 | 0.00 |
| (A) Organic acid containing hydroxyl group | Citric acid | mass % | 1.07 | 0.53 | 0.27 | 0.00 | 0.00 | 0.00 | 0.00 |
|  | Malic acid | mass % | 0.00 | 0.00 | 0.00 | 0.00 | 0.00 | 0.00 | 0.00 |
|  | Glycolic acid | mass % | 0.00 | 0.00 | 0.00 | 0.00 | 0.00 | 0.00 | 0.00 |
| (H) Organic acid containing no hydroxyl group | Oxalic acid (pKa1 = 1.04) | mass % | 0.00 | 0.00 | 0.00 | 1.07 | 0.00 | 0.00 | 0.00 |
|  | Malonic acid (pKa1 = 2.65) | mass % | 0.00 | 0.00 | 0.00 | 0.00 | 1.07 | 0.00 | 0.00 |
|  | Maleic acid (pKa1 = 1.75) | mass % | 0.00 | 0.00 | 0.00 | 0.00 | 0.00 | 1.07 | 0.00 |
|  | Acetic acid (pKa1 = 4.56) | mass % | 0.00 | 0.00 | 0.00 | 0.00 | 0.00 | 0.00 | 1.07 |
| (F) Oxidizing agent | Hydrogen peroxide | mass % | 9.00 | 9.00 | 9.00 | 9.00 | 9.00 | 9.00 | 9.00 |
| pH Regulator | Ammonia | — | — | — | — | — | — | — | — |
| Component (B) total |  | mass % | 0.54 | 0.54 | 0.54 | 0.54 | 0.54 | 0.54 | 0.54 |
| Component (C) total |  | mass % | 1.33 | 1.33 | 1.33 | 1.33 | 1.33 | 1.33 | 1.33 |
| Component (D) total |  | mass % | 0.08 | 0.37 | 0.19 | 0.19 | 0.19 | 0.19 | 0.19 |
| Component (A) total |  | mass % | 1.07 | 0.53 | 0.27 | 0.00 | 0.00 | 0.00 | 0.00 |
| Component (H) total |  | mass % | 0.00 | 0.00 | 0.00 | 1.07 | 1.07 | 1.07 | 1.07 |
| Chemical component total |  | mass % | 3.02 | 2.77 | 2.33 | 3.13 | 3.13 | 3.13 | 3.13 |
| Component (A) + component (H) total |  | mass % | 1.07 | 0.53 | 0.27 | 1.07 | 1.07 | 1.07 | 1.07 |
| Component (A)/component (D) (mass ratio) |  | — | 13.38 | 1.43 | 1.42 | 0.00 | 0.00 | 0.00 | 0.00 |
| pH |  | — | 2.4 | 2.4 | 2.5 | 2.4 | 2.4 | 2.4 | 2.9 |

TABLE 4-continued

| Component name | Substance name | Units | Comp. Ex. 8 | 9 | 10 | 11 | 12 | 13 | 14 |
|---|---|---|---|---|---|---|---|---|---|
| Etching rate | | Å/min | >1500 | 200 | 460 | 500 | 510 | 530 | 460 |
| Polishing rate | | Å/min | — | 28000 | 19000 | 43000 | 46000 | 48000 | 28000 |
| Pad stains | | — | — | — | B | B | B | B | B |

The following conclusions were drawn from the results shown in Tables 1 to 4. Specifically, polishing solutions 1 to 15 of Examples 1 to 15 had satisfactory etching rates and polishing rates, and no pad stains were observed.

On the other hand, with polishing solution X1 that did not comprise component (A), the polishing rate was reduced and pad stains were observed. The polishing rate was significantly reduced with polishing solutions X2 and 3, which differed from polishing solution 1 in that the content of component (B) was outside of the range of the invention. The polishing rate was reduced with polishing solutions X4 and X5, which differed from polishing solution 1 in that the content of component (C) was outside of the range of the invention. The etching rate was significantly increased with polishing solutions X6, X7 and X8, which differed from polishing solution 1 in that the content of component (D) was outside of the range of the invention. The polishing rate was reduced and pad stains were observed with polishing solutions X9 and X10, wherein the ratio of the content of component (A) with respect to the content of component (D) was outside of the range of the invention. With polishing solutions X11, X12 and X13, which comprised component (H) but did not comprise component (A), sufficient polishing rate was obtained but pad stains were observed. With polishing solution X14, which comprised acetic acid containing one carboxyl group as component (H) but did not comprise component (A), the polishing rate was reduced and pad stains were also observed.

When the contents of component (A), component (B) and component (C) were each increased and decreased with respect to polishing solution 1 (polishing solution 7 and polishing solutions X2 and X3 for component (B), polishing solutions 8 and 9 and polishing solutions X4 and X5 for component (C), and polishing solution 6 and polishing solution X10 for component (A)), it was found that it is necessary for each of the contents of component (A), component (B) and component (C) to be above certain content in order to achieve satisfactory polishing rate (for example, a polishing rate of 30000 Å/min or greater).

Furthermore, for all of the components, the proportion of increase in polishing rate with relatively high additive amount was smaller than the proportion of increase in polishing rate with relatively low additive amount. For example, with a component (B) content of not greater than 0.14 mass % (polishing solutions X2 and X3), the polishing rate was 10000 Å/min or lower. With a component (B) content of 0.27 mass % (polishing solution 7), the polishing rate exceeded 30000 Å/min, but the polishing rate only increased by 1000 Å/min when the component (B) content was increased from 0.27 mass % (polishing solution 7) to 0.54 mass % (polishing solution 1).

This suggests that, in order to obtain a target polishing rate, it is necessary for component (B) to be present at above a certain level, but the increase in polishing rate reaches a peak with addition of component (B) alone, and that only increasing the content of component (B) results in inefficient polishing rate increase. Thus, while the polishing rate can be increased to some extent by using component (A), component (B) and component (C) alone, or any 2 of these components, it was demonstrated that the polishing rate can be improved even more efficiently by adding each of the components at above certain amounts to increase the components in a well-balanced manner.

These results confirmed that, in order to obtain a polishing solution with an excellent etching rate and polishing rate and no observed pad stains, it is necessary to have component (A) with component (B), component (C) and component (D) in amounts above a certain level, and it is necessary for the ratio of the content of component (A) with respect to the content of component (D) to be above a certain level. A polishing solution with a polishing rate exceeding 30000 Å/min for copper is especially suitable for rapid polishing of large amounts of copper, for formation of TSVs, for example.

REFERENCE SIGNS LIST

1: Silicon substrate, 2: element, 4: copper film, 5, 6: bumps, 100, 200, 300: substrates.

The invention claimed is:

1. A polishing method comprising a step in which a copper-containing metal film is polished using a polishing solution to remove at least a portion of the copper-containing metal film at a polishing rate of 30,000 Å/min or greater,
the polishing solution comprising:
a first organic acid component which is at least one type selected from among an organic acid containing a hydroxyl group, a salt of the organic acid and an anhydride of the organic acid; an inorganic acid component which is at least one type selected from among a dibasic or greater inorganic acid and a salt of the inorganic acid; an amino acid; a protective film-forming agent; an abrasive grain; an oxidizing agent; and water,
wherein a content of the inorganic acid component in terms of inorganic acid is 0.15 mass % or greater, a content of the amino acid is 0.30 mass % or greater, a content of the protective film-forming agent is 0.10 mass % or greater, based on an entire polishing solution, and
a ratio of a content of the first organic acid component in terms of organic acid with respect to a content of the protective film-forming agent is at least 1.5.

2. The polishing method according to claim 1, the polishing solution further comprising a second organic acid component which is at least one type selected from among an organic acid containing no hydroxyl group, a salt of the organic acid and an anhydride of the organic acid.

3. The polishing method according to claim 2, wherein a total of the content of the first organic acid component in terms of organic acid and the content of the second organic acid component in terms of organic acid is 0.20 mass % or greater based on an entire polishing solution.

4. The polishing method according to claim 2, wherein the second organic acid component is at least one type selected from among an organic acid containing no hydroxyl group and 2 or more carboxyl groups, a salt of the organic acid and an anhydride of the organic acid, and a first acid dissociation constant of the organic acid is 1.0 to 3.0.

5. The polishing method according to claim 2, wherein the second organic acid component is at least one type selected from among oxalic acid, maleic acid, maleic anhydride and malonic acid.

6. The polishing method according to claim 1, wherein the content of the first organic acid component in terms of organic acid is 0.10 mass % or greater based on an entire polishing solution.

7. The polishing method according to claim 1, wherein the first organic acid component is an aliphatic hydroxycarboxylic acid.

8. The polishing method according to claim 1, wherein the first organic acid component is at least one type selected from among glycolic acid, malic acid and citric acid.

9. The polishing method according to claim 1, wherein a pH of the polishing solution is 1.5 to 4.0.

10. The polishing method according to claim 1, wherein the inorganic acid component is at least one type selected from among sulfuric acid and phosphoric acid.

11. The polishing method according to claim 1, wherein the amino acid is at least one type selected from among glycine, alanine, valine, leucine, isoleucine, serine, threonine, cysteine, cystine, methionine, aspartic acid, glutamic acid, lysine, arginine, phenylalanine, tyrosine, histidine, tryptophan, proline, oxyproline, asparagine and glutamine.

12. The polishing method according to claim 1, wherein the amino acid is glycine.

13. The polishing method according to claim 1, wherein the protective film-forming agent is at least one type selected from among quinaldinic acid, anthranilic acid, salicylaldoxime, a thiazole compound, a triazole compound, an imidazole compound, a pyrazole compound and a tetrazole compound.

14. The polishing method according to, wherein the protective film-forming agent is a triazole compound.

15. The polishing method according to claim 14, wherein the triazole compound is at least one type selected from among benzotriazole and a benzotriazole derivative.

16. The polishing method according to claim 1, wherein the abrasive grain comprises at least one type selected from among silica, alumina, zirconia, ceria, titania, silicon carbide, polystyrene, polyacryl and polyvinyl chloride.

17. The polishing method according to claim 1, wherein the abrasive grain comprises at least one type selected from among colloidal silica and colloidal alumina.

18. The polishing method according to claim 1, wherein a mean particle size of the abrasive grain is not greater than 100 nm.

19. The polishing method according to claim 1, wherein the oxidizing agent is at least one type selected from among hydrogen peroxide, persulfuric acid, a persulfuric acid salt, periodic acid, a periodic acid salt, an iodic acid salt and a bromic acid salt.

* * * * *